(12) United States Patent
Kim et al.

(10) Patent No.: US 9,417,954 B2
(45) Date of Patent: Aug. 16, 2016

(54) DATA STORAGE DEVICE AND METHOD FOR OPERATING THE SAME

(71) Applicant: SK hynix Inc., Gyeonggi-do (KR)

(72) Inventors: Ju Hee Kim, Gyeonggi-do (KR); Kwang Hyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/324,920

(22) Filed: Jul. 7, 2014

(65) Prior Publication Data

US 2015/0309864 A1    Oct. 29, 2015

(30) Foreign Application Priority Data

Apr. 23, 2014  (KR) ........................ 10-2014-0048833

(51) Int. Cl.
*H03M 13/11* (2006.01)
*G06F 11/10* (2006.01)
*H03M 13/29* (2006.01)
*H03M 13/53* (2006.01)

(52) U.S. Cl.
CPC ....... *G06F 11/1008* (2013.01); *H03M 13/2942* (2013.01)

(58) Field of Classification Search
CPC ............ G06F 11/1008; G06F 11/1076; G06F 11/1068; G06F 11/1072; G06F 11/10; H03M 13/2957; H03M 13/29; H03M 13/09; H03M 13/2942; H04L 1/0061
See application file for complete search history.

(56) References Cited

U.S. PATENT DOCUMENTS 8,464,136 B2 *   6/2013  Tsai ................... G06F 11/1068
                                                          714/763
2002/0194571 A1 * 12/2002  Parr ...................... H03M 13/09
                                                          714/800

FOREIGN PATENT DOCUMENTS

KR          100772393        11/2007

* cited by examiner

*Primary Examiner* — Cynthia Britt
*Assistant Examiner* — Dipakkumar Gandhi
(74) *Attorney, Agent, or Firm* — IP & T Group LLP (57) ABSTRACT

A method for operating a data storage device that includes reading data and storage parity data, generating transformation parity data through a masking operation on the storage parity data, and performing an error correcting operation on the data, based on the transformation parity data.

18 Claims, 9 Drawing Sheets

DATA STORAGE DEVICE AND METHOD FOR OPERATING THE SAME

CROSS-REFERENCES TO RELATED APPLICATION

The present application claims priority under 35 U.S.C. §119(a) to Korean Application Number 10-2014-0048833, filed on Apr. 23, 2014, which is incorporated herein by reference in its entirety.

BACKGROUND

1. Technical Field

Various exemplary embodiments of the present invention relate to a data storage device, and more particularly, to a method for operating an error correction code ("ECC") unit included in a data storage device.

2. Related Art

Nonvolatile memory apparatus may retain stored data even when power is blocked. Examples of nonvolatile memory apparatus include flash memory such as NAND-type flash memory and NOR-type flash memory, ferroelectric random access memory (FeRAM), phase-change random access memory (PCRAM), magnetoresistive random access memory (MRAM) and resistive random access memory (ReRAM).

A nonvolatile memory apparatus may be used in a system which requires continuous retention of data. For example, a nonvolatile memory apparatus may be used in a digital camera to store images or in a digital audio player to store audio data.

The data transmitted to the exterior from a nonvolatile memory apparatus by an external read request may be damaged due to various reasons and, therefore, may include errors. The errors in the data may occur when or while the data is stored in the nonvolatile memory apparatus. Errors in the data may also occur while the data is transmitted to the exterior through a data bus after being read from the nonvolatile memory apparatus. Therefore, a system including a nonvolatile memory apparatus may additionally include an ECC unit to detect and correct errors in the data.

SUMMARY

In an embodiment of the present invention, a method for operating a data storage device may include reading data and storage parity data, generating transformation parity data through a masking operation on the storage parity data, and performing an error correcting operation on the data, based on the transformation parity data.

In an embodiment of the present invention, a data storage device may include a nonvolatile memory device suitable for reading data and storage parity data, and an error correction code (ECC) unit suitable for generating transformation parity data through a masking operation on the storage parity data, and performing an error correcting operation on the data, based on the transformation parity data.

DETAILED DESCRIPTION

Hereinafter, a data storage device and a method for operating the same will be described below with reference to the accompanying drawings through various embodiments.

The drawings may not be necessarily to scale and, in some instances, proportions of the structures in the drawings are exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1:
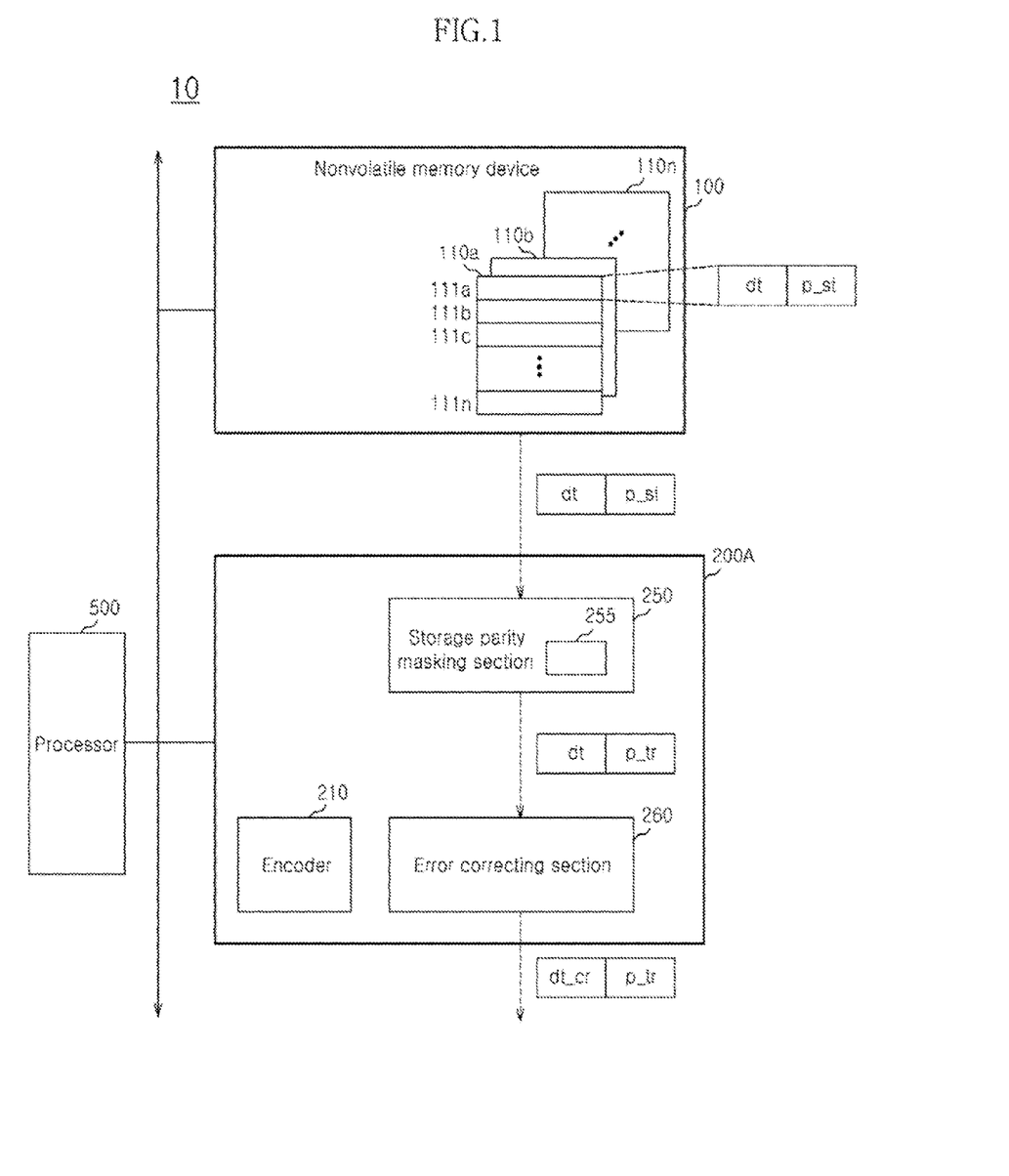
FIG. 1 is a block diagram illustrating a representation of an example of a data storage device in accordance with an embodiment of the present invention.

FIG. 1 is a block diagram illustrating an example of a data storage device 10 in accordance with an embodiment of the present invention.

The data storage device 10 may store the data provided from an exterior (e.g., an external device), in response to an external write request. Additionally, the data storage device 10 may provide stored data to the exterior in response to an external read request.

The data storage device 10 may include a personal computer memory card international association (PCMCIA) card, a compact flash (CF) card, a smart media card, a memory stick, a multimedia card in the form of an MMC, an eMMC, an RS-MMC and a micro-MMC, a secure digital card in the form of an SD, a mini-SD and a micro-SD, a universal flash storage (UFS), or a solid-state drive (SSD).

The data storage device 10 may include a nonvolatile memory device 100, an ECC unit 200A, and a processor 500.

The processor 500 may control general operations of the data storage device 10. The processor 500 may generate a write, read or erase command and provide the generated command to the nonvolatile memory device 100 to control the write, read or erase operations of the nonvolatile memory device 100.

The nonvolatile memory device 100 may include a plurality of memory blocks 110a to 110n. The nonvolatile memory device 100 may perform an erase operation on a memory block as an erase target, among the plurality of memory block 110a to 110n, in response to the erase command from the processor 500. That is, the nonvolatile memory device 100 may perform the erase operation on a unit of a memory block. In the erase operation, the nonvolatile memory device 100 may perform a control task in which all the memory cells included in one memory block are simultaneously accessed.

The memory cells (i.e., "erased memory cells") included in a memory block (i.e., an "erased memory block") for which the erase operation is performed may exist in a specified state. For example, the erased memory cells may form a specified threshold voltage distribution with a voltage level lower than 0V.

The erased memory cells may be in a state in which they store data with a specified value. That is, if the read operation is performed for the erased memory cells, the data with the specified value may be read. Hereafter, the data with the specified value, which are stored in the erased memory cells, may be defined as erase data. Hereafter, it is presumed that the specified value corresponding to the erase data is data "1".

The first memory block 110a may include a plurality of pages 111a to 111n. The nonvolatile memory device 100 may perform the write operation on a page as a write target, among the plurality of pages 111a to 111n in response to a write command from the processor 500. The nonvolatile memory device 100 may perform a read operation on a page as a read target, among the plurality of pages 111a to 111n, in response to a read command from the processor 500. That is, the nonvolatile memory device 100 may perform the write operation or the read operation on a unit of a page. In the write operation or the read operation, the nonvolatile memory device 100 may control all the memory cells included in one page to be simultaneously accessed.

When a write operation is performed for each of a plurality of pages, data dt and storage parity data p_st may be stored in each page. FIG. 1 exemplarily shows a first page 111a in which the data dt and the storage parity data p_st are stored. The data dt may be, for example, user data write-requested from the exterior.

The storage parity data p_st may include information (i.e., "error detection information") for detecting an error which is likely to occur in the data dt, when the stored data dt is read. The storage parity data p_st may be generated immediately before the data dt is stored in the nonvolatile memory device 100. The generated storage parity data p_st may be stored together with the data dt in the first page 111a. The stored storage parity data p_st may be read together with the data dt when the data dt is read. The error detection information included in the read storage parity data p_st may be used for an error correcting operation to detect whether an error has occurred in the data dt read and to correct a potential error.

The data dt and the storage parity data p_st may be changed to have a value corresponding to erase data, when an erase operation is performed for the first memory block 110a, that is, when the first page 111a is erased. The storage parity data p_st having a value corresponding to the erase data no longer includes error detection information. When the storage parity data p_st is read s together with the data dt not including the error detection information, the storage parity data p_st may not be used for the error correcting operation on the data dt. The ECC unit 200A may generate transformation parity data through a masking operation on the storage parity data p_st, for the error correcting operation on the data dt, even though the data dt and the storage parity data p_st are read from an erased page.

The ECC unit 200A may include an encoder 210, a storage parity masking section 250, and an error correcting section 260.

The encoder 210 may encode the data dt, before the corresponding data dt is stored in the nonvolatile memory device 100, such that the error correcting operation may be performed for the data dt read afterwards, as described above. The encoder 210 may encode the data dt based on error correction codes.

When a write request is generated for data with only "1" the encoder 210 may generate specified parity data for the corresponding data. The generated specified parity data will include error detection information for the data with only "1". Since the data with only "1" is substantially the same as the erase data, the generated specified parity data will include error detection information for the erase data. Hereafter, the specified parity data including the error detection information for the erase data may be defined as erase parity data.

The storage parity masking section 250 may perform the masking operation on the storage parity data p_st read, by using a masking pattern 255. When the storage parity masking section 250 performs the masking operation, the storage parity masking section 250 may generate transformation parity data p_tr through a logic operation on the storage parity data p_st and the masking pattern 255. The storage parity masking section 250 may substitute the storage parity data p_st by the generated transformation parity data p_tr and may output the transformation parity data p_tr.

Figure 2:
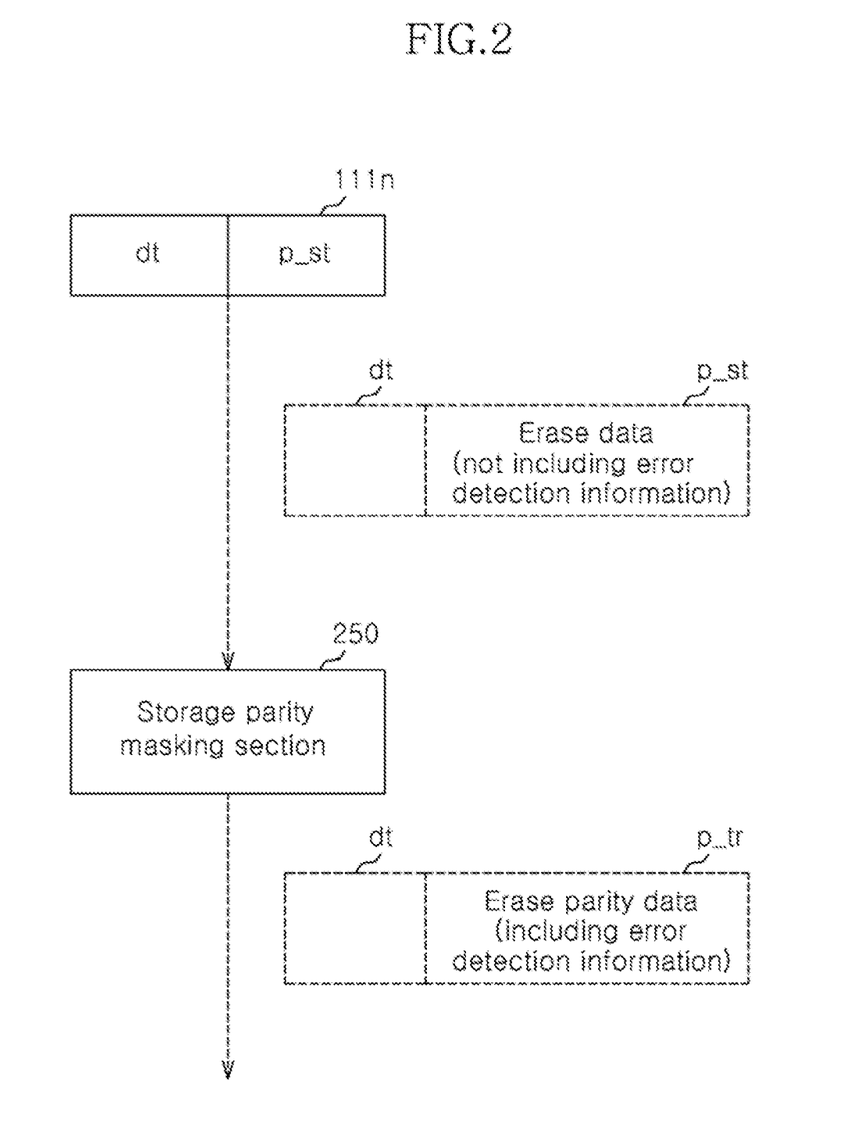
FIG. 2 is a diagram illustrating the operation of a storage parity masking section when data and storage parity data are read from an erased page.

FIG. 2 is a diagram illustrating the operation of the storage parity masking section 250 when the data dt and the storage parity data p_st are read from a page (Le., as an "erased page") included in an erased memory block.

For example, when the first page 111a is erased, as described above, the data dt and the storage parity data p_st may be changed to have a value corresponding to the erase data, and as a result, the storage parity data p_st may not include the error correction information for the data dt. When the storage parity data p_st having a value corresponding to the erase data is read, the storage parity masking section 250 may generate the transformation parity data p_tr with the same values as the erase parity data. According to the aforementioned definition, since the erase parity data includes the error detection information for the erase data, the generated transformation parity data p_tr may include the error detection information for the erase data.

Even though the storage parity data p_st read from the erased page does not include the error detection information for the data dt, the transformation parity data p_tr generated by the storage parity masking section 250 may include the error detection information for the erase data, that is, the error detection information for the data dt. The generated transformation parity data p_tr may be used for the error correcting operation on the data dt, by the error correcting section 260.

Referring back to FIG. 1, the error correcting section 260 may perform an error correcting operation on the data dt, based on the transformation parity data p_tr. The error correcting section 260 may output error-corrected data dt_cr and the transformation parity data p_tr, through the error correcting operation.

Figure 3:
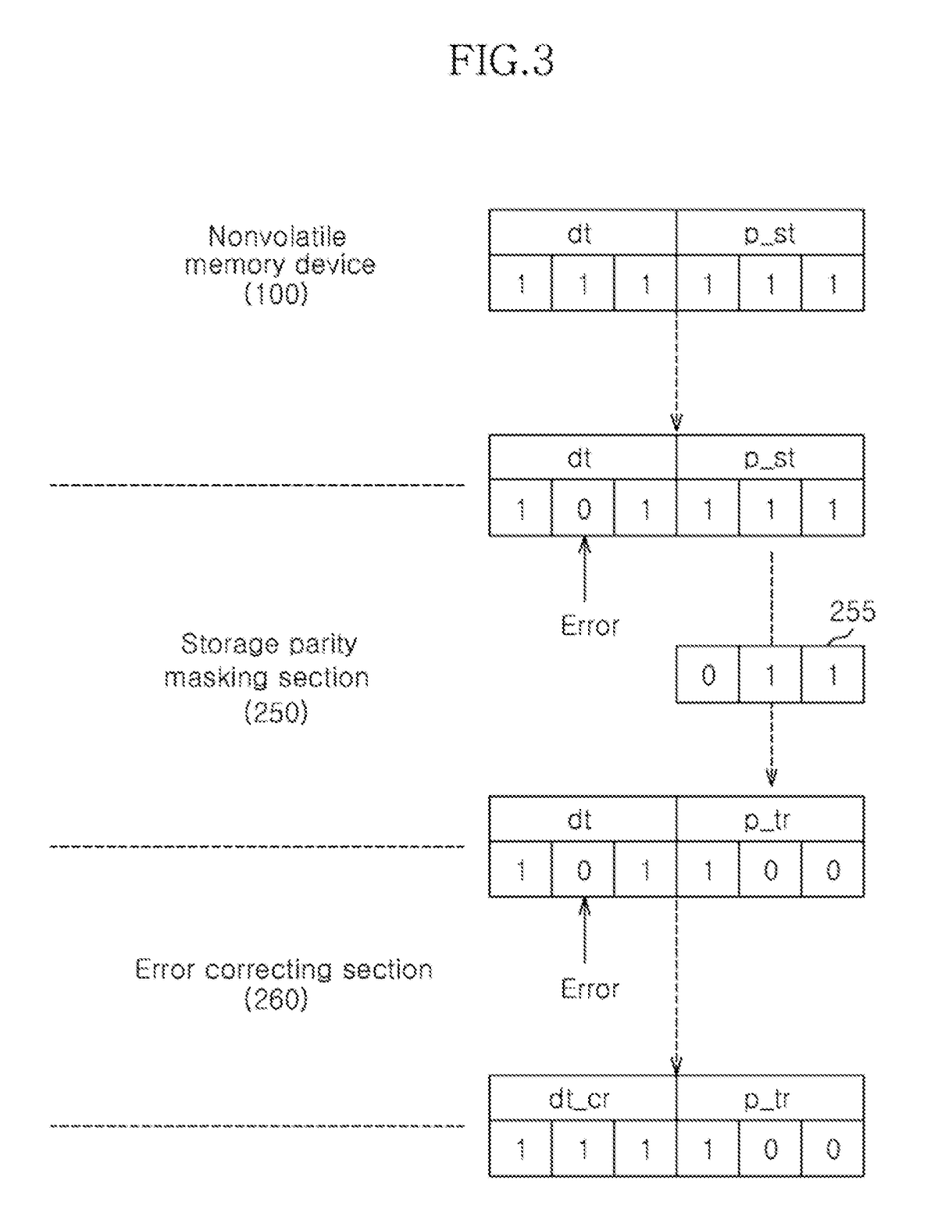
FIG. 3 is a diagram illustrating the operation of the ECC unit shown in FIG. 1.

FIG. 3 is a diagram illustrating the operation of the ECC unit 200A shown in FIG. 1. Referring to FIG. 3, a processing procedure of the ECC unit 200A for the data dt and the storage parity data p_st read from the nonvolatile memory device 100 is shown.

In FIG. 3, it is presumed that the data dt and the storage parity data p_st are read from an erased page. Therefore, the storage parity data p_st does not include the error detection information for the data dt. Furthermore, it is presumed that both of the data dt and the storage parity data p_st has 3 bits.

Before describing FIG. 3, it is presumed that the erase parity data are {1, 0, 0}. Namely, if a write request is generated from the exterior, for data {1, 1, 1} which is substantially the same as the erase data, the encoder 210 may generate the erase parity data {1, 0, 0} to include the error detection information for the write-requested data {1, 1, 1}. The erase parity data {1, 0, 0} may include the error detection information for the erase data.

Referring to FIG. 3, the data dt and the storage parity data p_st stored in the erased page in the nonvolatile memory device 100 may have a value corresponding to the erase data. The data dt and the storage parity data p_st, which is read, may include an error which has occurred due to various factors.

The storage parity masking section 250 may perform the masking operation on the storage parity data p_st which is read from the erased page. The storage parity masking section 250 may generate the transformation parity data p_tr through a logic operation on the storage parity data p_st and the masking pattern 255. The storage parity masking section 250 may generate the transformation parity data p_tr through an exclusive OR operation on the respective bits of the storage parity data p_st and the respective bits of the masking pattern 255. The masking pattern 255, through the exclusive OR operation, may be set to generate the transformation parity data p_tr having the same values as the erase parity data, by using the storage parity data p_st having a value corresponding to the erase data. The transformation parity data p_tr having the same values as the erase parity data may include the error detection information for the erase data.

The error correcting section 250 may perform the error correcting operation on the data dt by referring to the transformation parity data p_tr, which includes the error detection information for the erase data. The error correcting section 260 may output the error-corrected data dt_cr and the transformation parity data p_tr through the error correcting operation.

Figure 4:
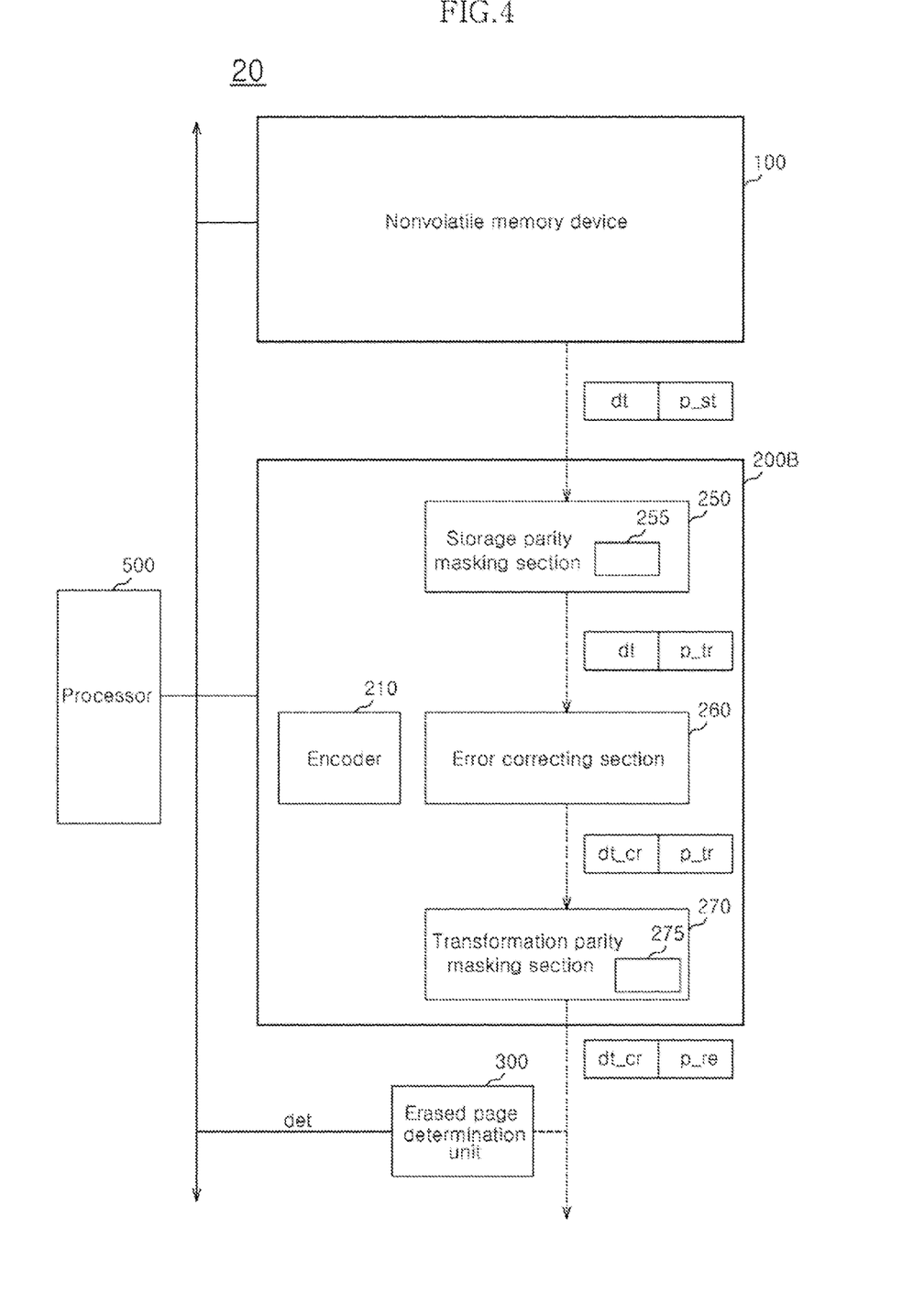
FIG. 4 is a block diagram illustrating an example of a data storage device in accordance with an embodiment of the present invention.

FIG. 4 is a block diagram illustrating an example of a data storage device 20 in accordance with an embodiment of the present invention. In FIG. 4, the same reference numerals as in FIG. 1 will be used for substantially the same component elements as the component elements of the data storage device 10 described above with reference to FIG. 1, and detailed descriptions for the corresponding component elements will be omitted herein.

The data storage device 20 may determine whether the pages included in a nonvolatile memory device 100 are erased or not. For example, when a sudden power-off occurs during a write operation of the nonvolatile memory device 100, the data storage device 20 may determine whether or not each of the sequential pages in the nonvolatile memory device 100 is an erased page. In this case, an unerased page may be detected following erased pages, which are consecutively detected, and the data storage device 20 may determine that a write operation was performed up to the corresponding unerased page immediately before the sudden power-off. The data storage device 20 may control the write operation of the nonvolatile memory device 100, to be restarted from an erased page, which is next to the corresponding unerased page.

To determine whether a page is an erased page, the data storage device 20 may read data from a page as a determination target and may determine whether the page is an erased page, based on the read data. Since the data read from the nonvolatile memory device 100 may include an error which has occurred due to various factors, an inaccurate result may be outputted if the data storage device 20 determines whether a page is an erased page, by referring to the data including the error.

The data storage device 20 of FIG. 4 may perform an error correcting operation on read data before determining whether a page is an erased page, and then, based on error-corrected data, may determine whether a page is an erased page. Particularly, even though data is read from an erased page, the data storage device 20 may perform the error correcting operation on the read data, as described above with reference to FIGS. 1 to 3.

The data storage device 20 may include a nonvolatile memory device 100, an ECC unit 200B, an erased page determination unit 300, and a processor 500. The ECC unit 200B may include an encoder 210, a storage parity masking section 250, an error correcting section 260, and a transformation parity masking section 270.

The transformation parity masking section 270 may perform a masking operation on the transformation parity data p_tr, by using a masking pattern 275. When the masking operation is performed, the transformation parity masking section 270 may generate recovery parity data p_re through a logic operation on the transformation parity data p_tr and the masking pattern 275. Through using the masking pattern 275, which is the same as masking pattern 255, the transformation parity masking section 270 may generate the recovery parity data p_re which is substantially the same as the storage parity data p_st originally stored in the nonvolatile memory device 100. The transformation parity masking section 270 may substitute the transformation parity data p_tr by the generated recovery parity data p_re and may output the recovery parity data p_re.

The erased page determination unit 300 may determine whether the data dt and the storage parity data p_st are data which is read from an erased page, based on error-corrected data dt_cr and the generated recovery parity data p_re. That is, the erased page determination unit 300 may determine whether a page for which a read operation is performed is an erased page, based on the error-corrected data dt_cr and the generated recovery parity data p_re. When the error-corrected data dt_cr and the recovery parity data p_re have a value corresponding to the erase data, the erased page determination unit 300 may determine the corresponding page as an erased page. When the error-corrected data dt_cr and the recovery parity data p_re do not have a value corresponding to the erase data, the erased page determination unit 300 may determine the corresponding page as an unerased page.

The erased page determination unit 300 may determine whether the error-corrected data dt_cr and the recovery parity data p_re have a value corresponding to the erase data, through an AND operation on the respective bits of the error-corrected data dt_cr and the recovery parity data p_re. For example, when a result of the AND operation is "1", the erased page determination unit 300 may determine that the error-corrected data dt_cr and the recovery parity data p_re have a value corresponding to the erase data. For example, when a result of the AND operation is "0", the erased page determination unit 300 may determine that the error-corrected data dt_cr and the recovery parity data p_re do not have a value corresponding to the erase data.

The erased page determination unit 300 may output a detection signal det according to a determination result.

Figure 5:
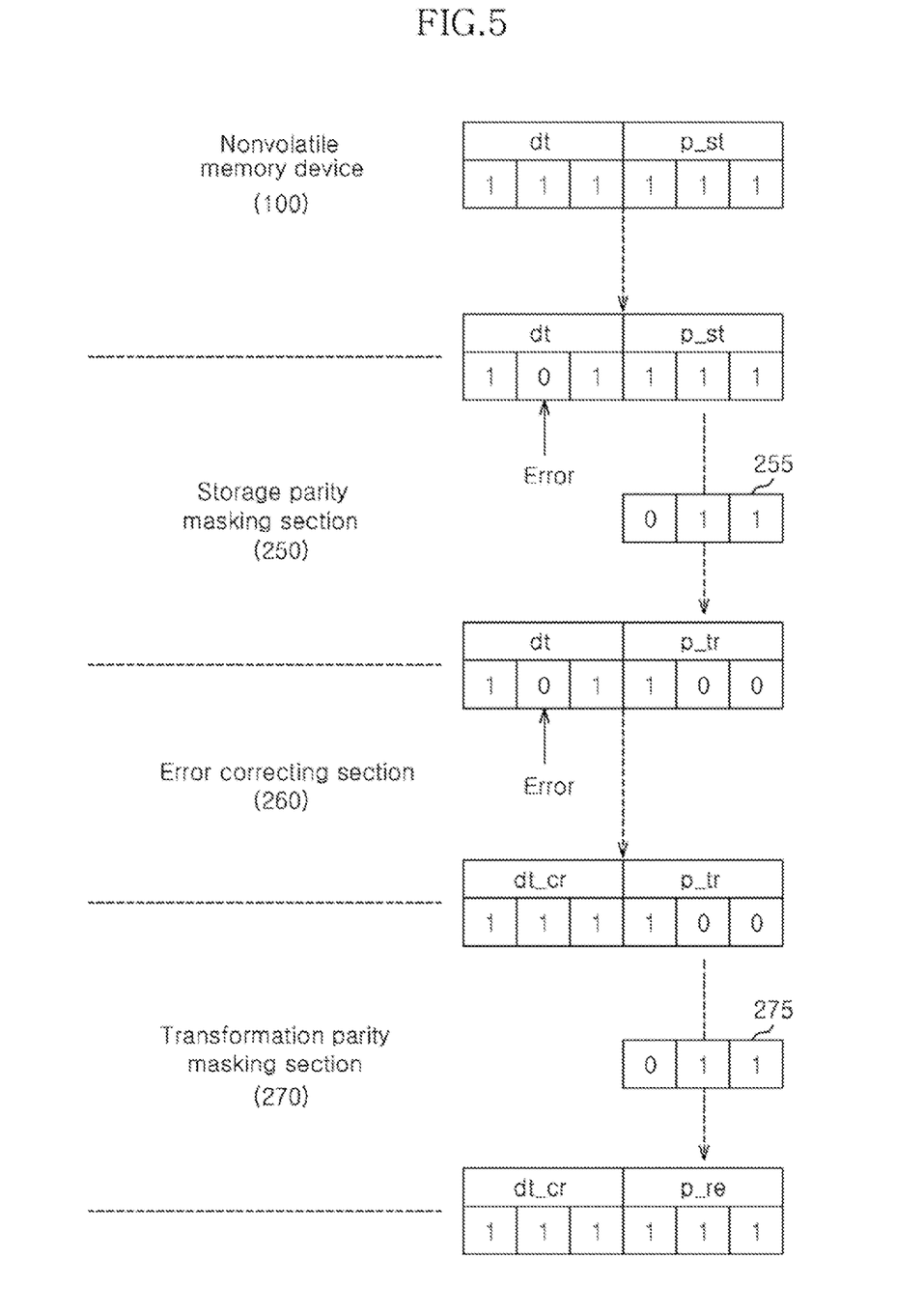
FIG. 5 is a diagram illustrating the operation of the ECC unit shown in FIG. 4.

FIG. 5 is a diagram illustrating the operation of the ECC unit 200B shown in FIG. 4. Referring to FIG. 5, the processing procedure of the ECC unit 200B is shown for the data dt and the storage parity data p_st read from the nonvolatile memory device 100.

In FIG. 5, it is presumed that the data dt and the storage parity data p_st are read from an erased page. Therefore, the storage parity data p_st does not include the error detection information for the data dt. Furthermore, it is presumed that each of the data dt and the storage parity data p_st has 3 bits. It is presumed that erase parity data are {1, 0, 0}.

Hereinafter, in describing FIG. 5, differences from the processing procedure of the ECC unit 200A described above with reference to FIG. 3 will be illustrated.

As described above, the error correcting section 260 may perform the error correcting operation on the data dt, by referring to the generated transformation parity data p_tr, and may output the error-corrected data dt_cr and the transformation parity data p_tr.

The transformation parity masking section 270 may generate the recovery parity data p_re, through an exclusive OR operation on the respective bits of the transformation parity data p_tr and the respective bits of the masking pattern 255. The transformation parity masking section 270 may generate the recovery parity data p_re that is substantially the same as the storage parity data p_st. That is, the transformation parity masking section 270 may generate the recovery parity data p_re to be the same as the storage parity data p_st, since it may be possible to recover the transformation parity data p_tr to the storage parity data p_st due to the characteristics of the exclusive OR operation, when using the masking pattern 275 which is the same as the masking pattern 255.

The erased page determination unit 300 may determine whether the error-corrected data dt_cr and the recovery parity data p_re have a value corresponding to the erase data, through an AND operation on the respective bits of the error-corrected data dt_cr and the recovery parity data p_re. The result of the AND operation on the respective bits of he error-corrected data dt_cr and the recovery parity data p_re may be outputted as "1". Therefore, the erased page determination unit 300 may determine that the error-corrected data dt_cr and the recovery parity data p_re have a value corresponding to the erase data. Furthermore, the erased page determination unit 300 may determine that the data dt and the storage parity data p_st are read from an erased page.

Figure 6:
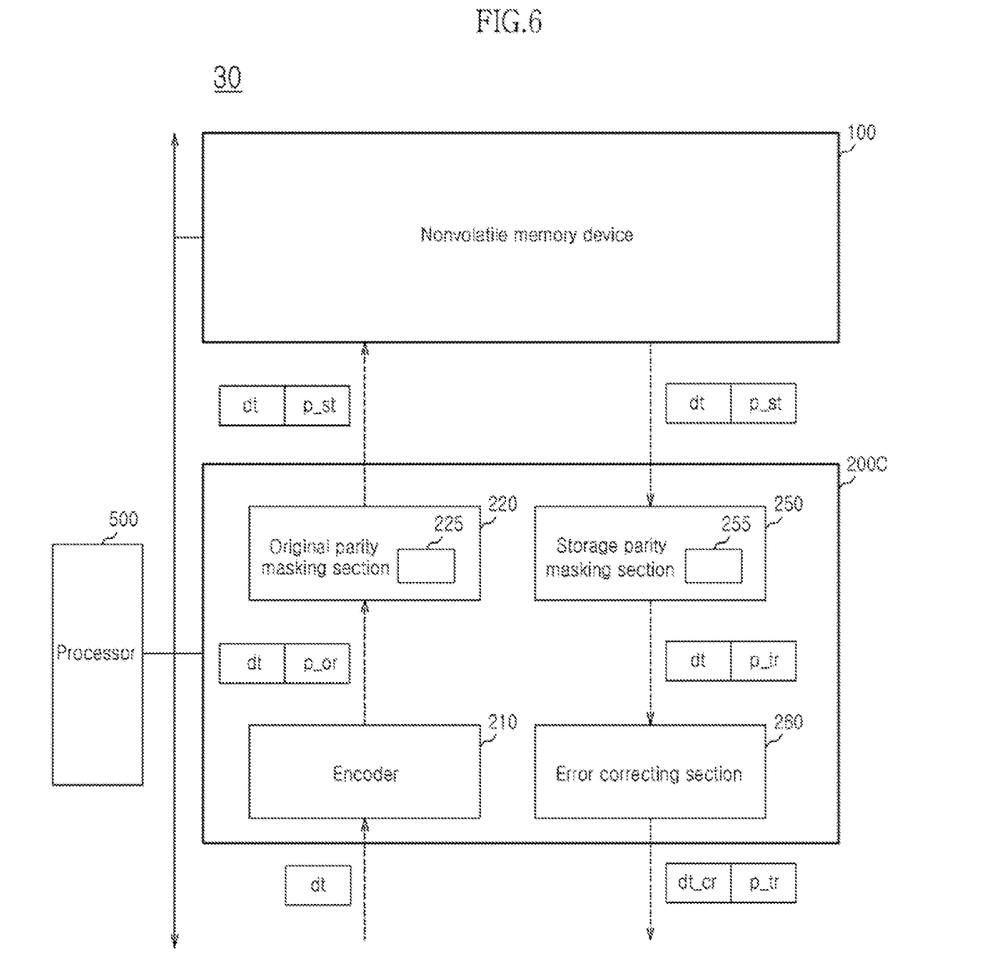
FIG. 6 is a block diagram illustrating an example of a data storage device in accordance with an embodiment of the present invention.

In summary, the data storage device 20 described above with reference to FIGS. 4 and 5 may determine whether the data read from the nonvolatile memory device 100 is data which is read from an erased page. The data storage device 20 may perform the error correcting operation on the read data, and may determine whether a page for which the read operation is performed is an erased page, based on the error-corrected data FIG. 6 is a block diagram illustrating a representation of an example of a data storage device 30 in accordance with an embodiment of the present invention. Referring to FIG. 6, the data storage device 30 is shown which stores data dt in a nonvolatile memory device 100 and performs an error correcting operation on the data dt read. In FIG. 6, the same reference numerals as in FIG. 1 will be used for substantially the same component elements as the component elements of the data storage device 10 described above with reference to FIG. 1, and detailed descriptions for the corresponding component elements will be omitted herein.

The data storage device 30 may include a nonvolatile memory device 100, an ECC unit 200C, and a processor 500. The ECC unit 200C may include an encoder 210, an original parity masking section 220, a storage parity masking section 250, and an error correcting section 260. The data storage device 30 may be provided with write-requested data dt from an exterior.

The encoder 210 may decode the data dt before the write-requested data dt is stored in the nonvolatile memory device 100, such that an error correcting operation may be performed for the data dt read afterwards. The encoder 210 may encode the data dt based on error correction codes. As a result of the encoding, the encoder 210 may generate original parity data p_or including the error detection information of the data dt. The encoder 210 may output the generated original parity data p_or by adding them to the data dt.

The original parity masking section 220 may perform a masking operation on the generated original parity data p_or, by using a masking pattern 225. When the masking operation is performed, the original parity masking section 220 may generate storage parity data p_st through a logic operation on the original parity data p_or and the masking pattern 225. The original parity masking section 220 may substitute the original parity data p_or with the generated storage parity data p_st and may output the storage parity data p_st.

The original parity masking section 220 may perform the masking operation to compensate in advance for the effect of a masking operation by the storage parity masking section 250 when the data dt and the storage parity data p_st, stored in the nonvolatile memory device 100, are read afterwards. As will be described later, the effect of the masking operation by the original parity masking section 220 may be offset by the effect of the masking operation by the storage parity masking section 250.

The nonvolatile memory device 100 may store the data dt and the storage parity data p_st through a write operation, in response to a write command. The nonvolatile memory device 100 may read the data dt and the storage parity data p_st through a read operation, in response to a read command.

The storage panty masking section 250 may perform the masking operation on the read storage parity data p_st, by using a masking pattern 255. When the storage parity masking section 250 performs the masking operation, the storage parity masking section 250 may generate transformation parity data p_tr through a logic operation on the storage parity data p_st and the masking pattern 255. The storage parity masking section 250 may substitute the storage parity data p_st with the generated transformation parity data p_tr and may output the transformation parity data p_tr.

The storage parity masking section 250 may generate the transformation parity data p_tr which is substantially the same as the original parity data p_or, through using the masking pattern 255 which is the same as the masking pattern 225. The storage parity data p_st transformed from the original parity data p_or by the original parity masking section 220 may be recovered to the original parity data p_or by the storage parity masking section 250. That is, the effect of the masking operation by the storage parity masking section 250 may offset the effect of the masking operation by the original parity masking section 220. Since the generated transformation parity data p_tr is substantially the same as the original parity data p_or, the generated transformation parity data p_tr may include the error detection information for the data dt.

The error correcting section 260 may perform an error correcting operation on the data dt, by referring to the transformation parity data p_tr which includes the error detection information for the data dt.

Figure 7:
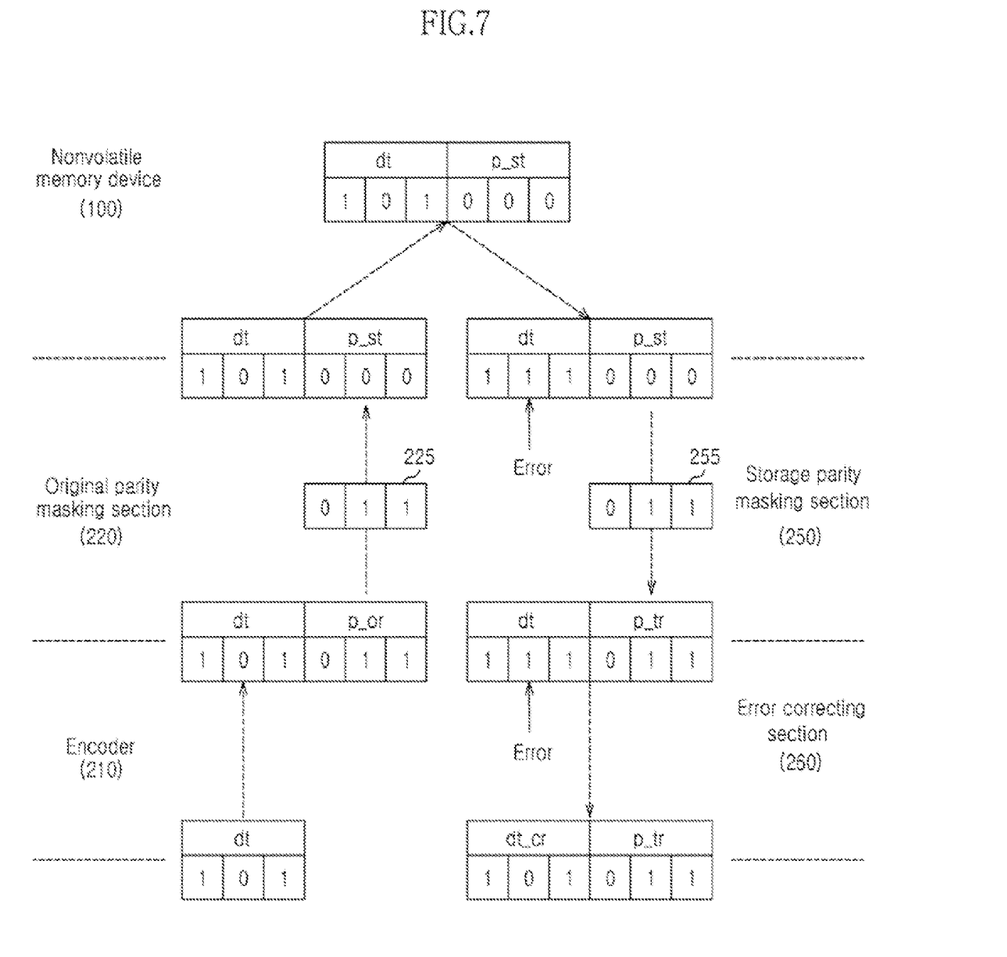
FIG. 7 is a diagram illustrating the operation of the ECC unit shown in FIG. 6.

FIG. 7 is a diagram illustrating the operation of the ECC unit 200C shown in FIG. 6. Referring to FIG. 7, the processing procedure of the ECC unit 200C is shown for the data dt before the data dt is stored in the nonvolatile memory device 100 and after the data dt is read from the nonvolatile memory device 100. In FIG. 7, it is presumed that the data dt to be stored in the nonvolatile memory device 100 and the original parity data p_or generated by the encoder 210 has 3 bits.

Hereinafter, in describing FIG. 7, differences from the processing procedure of the ECC unit 200A described above with reference to FIG. 3 will be illustrated.

The encoder 210 may generate the original parity data p_or which includes the error detection information of the data dt. The encoder 210 may output the generated original parity data p_or by adding them to the data dt.

The original parity masking section 220 may generate the storage parity data p_st through an exclusive OR operation on the respective bits of the generated original parity data p_or and the respective bits of the masking pattern 225. Since the original parity masking section 220 performs the masking operation to compensate for, in advance, the masking operation of the storage parity masking section 250, the original parity masking section 220 may use a masking pattern 225 which is substantially the same as the masking pattern 255.

The nonvolatile memory device 100 may store the data dt and the storage parity data p_st in response to a write command. Furthermore, the nonvolatile memory device 100 may read the data dt and the storage parity data p_st in response to a read command. The data dt and the storage parity data p_st read from the nonvolatile memory device 100 may include an error which has occurred due to various factors.

The storage parity masking section 250 may generate the transformation parity data p_tr through an exclusive OR operation on the respective bits of the read storage parity data p_st and the respective bits of the masking pattern 255. The storage parity masking section 250 may generate the transformation parity data p_tr which is substantially the same as the original parity data p_or originally generated by the encoder 210. That is, the storage parity masking section 250 may perform the masking operation to offset the effect of the masking operation by the original parity masking section 220. The storage parity masking section 250 may generate the transformation parity data p_tr to be the same as the original parity data p_or, since it may possible to recover the storage parity data p_st to the original parity data p_or due to the characteristic of the exclusive OR operation, when using the masking pattern 255 which is the same as the masking pattern 225.

The error correcting section 260 may perform the error correcting operation on the data dt, by referring to the generated transformation parity data p_tr.

The ECC unit 200C described above with reference to FIGS. 6 and 7 may perform the error correcting operation on the data read from an unerased page. Since the ECC unit 200O performs the masking operation by using the same masking pattern as in the ECC unit 200A of FIG. 1, the ECC unit 200O may perform the error correcting operation for data read from an erased page, by substantially the same method as in the ECC unit 200A of FIG. 1.

Figure 8:
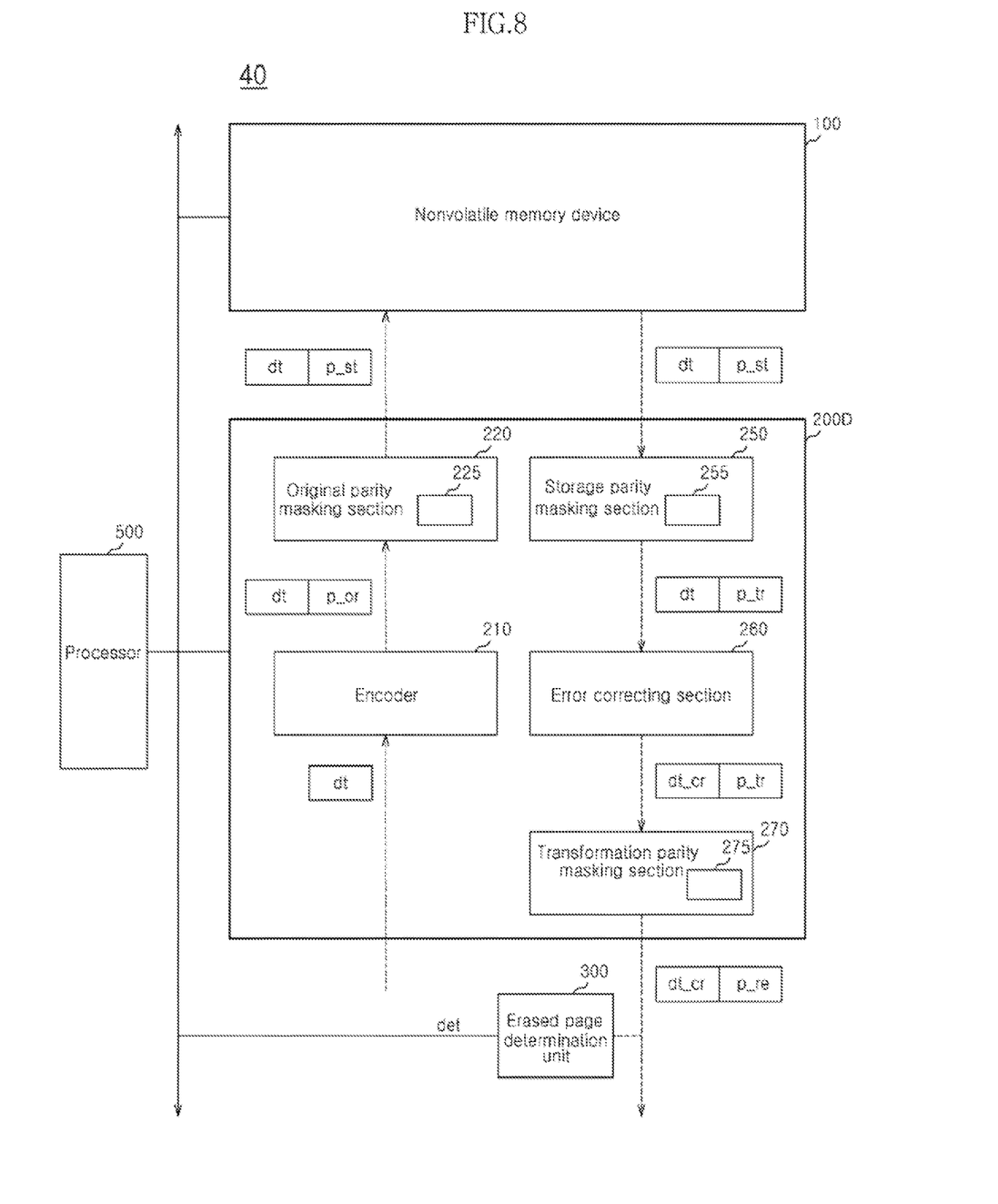
FIG. 8 is a block diagram illustrating an example of a data storage device in accordance with an embodiment of the present invention.

FIG. 8 is a block diagram illustrating an example of a data storage device 40 in accordance with an embodiment of the present invention. In FIG. 8, the same reference numerals as in FIGS. 4 and 6 will be used for substantially the same component elements as the component elements of the data storage devices 20 and 30 described above with reference to FIGS. 4 and 6, and detailed descriptions for the corresponding component elements will be omitted herein.

The data storage device 40 may include a nonvolatile memory device 100, an ECC unit 200D, an erased page determination unit 300, and a processor 500. The ECC unit 200D may include an encoder 210, an original parity masking section 220, a storage parity masking section 250, an error correcting section 260, and a transformation parity masking section 270.

Figure 9:
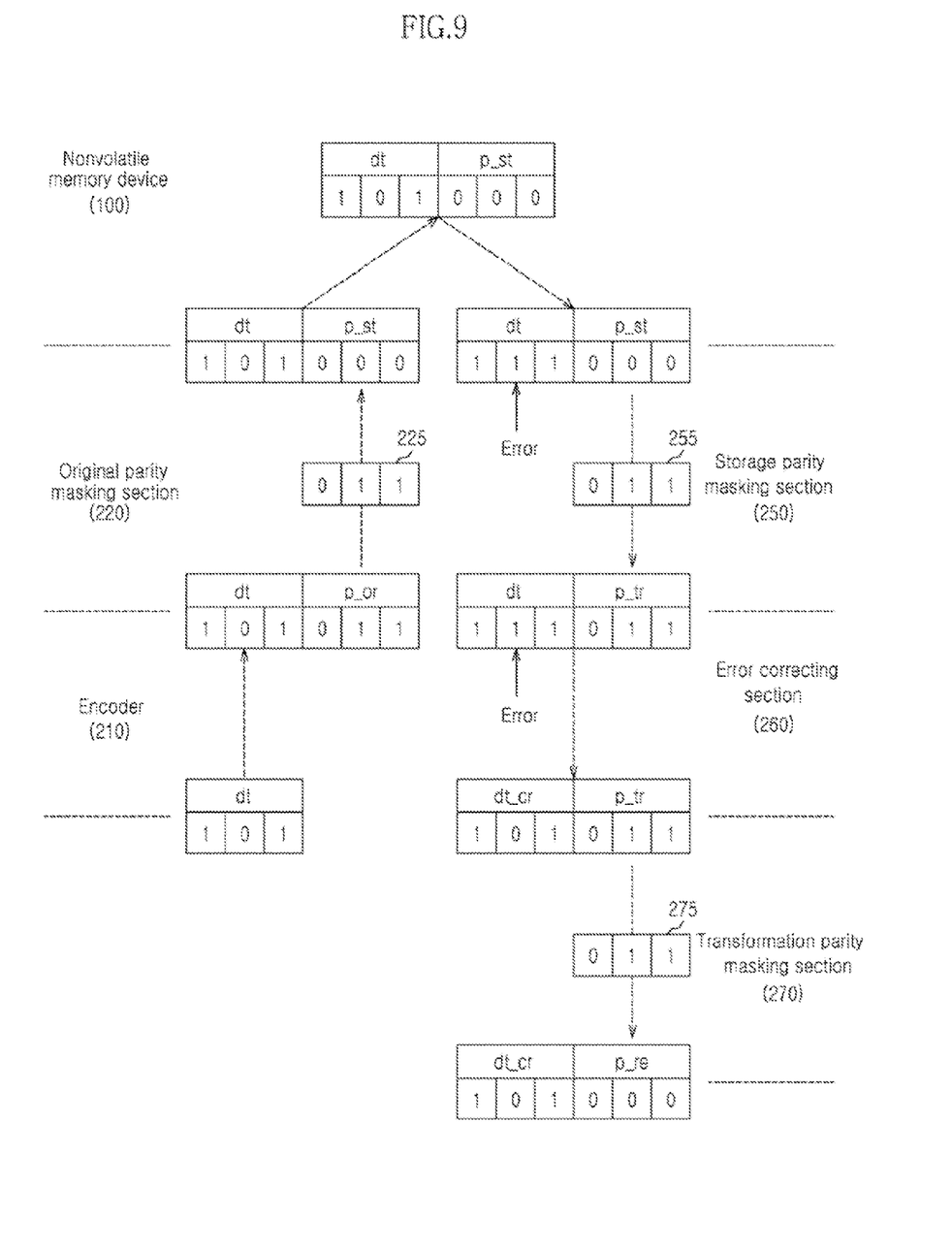
FIG. 9 is a diagram illustrating the operation of ECC unit shown in FIG. 8.

FIG. 9 is a diagram illustrating the operation of the ECC unit 200D shown in FIG. 8. Referring to FIG. 9, the processing procedure of the ECC unit 200D is shown for data dt before the data dt is stored in the nonvolatile memory device 100 and after the data dt is read from the nonvolatile memory device 100. In FIG. 9, it is presumed that all of the data dt stored in the nonvolatile memory device 100 and the original parity data p_or generated by the encoder 210 has 3 bits.

Hereinafter, in describing FIG. 9, differences from the processing procedure of the ECC unit 200C described above with reference to FIG. 7 will be illustrated.

As mentioned above, the error correcting section 260 may perform an error correcting operation on the data dt, by referring to generated transformation parity data p_tr and may output error-corrected data dt_cr and the transformation parity data p_tr.

The transformation parity masking section 270 may generate recovery parity data p_re through an exclusive OR operation on the respective bits of the transformation parity data p_tr and the respective bits of a masking pattern 275 which is set. The transformation parity masking section 270 may generate the recovery parity data p_re which is substantially the same as the storage parity data p_st.

The erased page determination unit 300 may determine whether error-corrected data dt_cr and the recovery parity data p_re have a value corresponding to erase data, through an AND operation on the respective bits of the error-corrected data dt_cr and the recovery parity data p_re. A result of the AND operation on the respective bits of the error-corrected data dt_cr and the recovery parity data p_re may be outputted as "0". Therefore, the erased page determination unit 300 may determine that the error-corrected data dt_cr and the recovery parity data p_re do not have a value corresponding to the erase data. Furthermore, the erased page determination unit 300 may determine that the data dt and the storage parity data p_st are read from an unerased page.

As is apparent from the above descriptions, the data storage device according to the embodiments of the present invention may perform an error correcting operation on data read from an erased page and may determine whether read data is data read from an erased page.

While certain embodiments have been described above, it will be understood to those skilled in the art that the embodiments described are by way of example only. Accordingly, the data storage device and the operating method thereof described herein should not be limited based on the described embodiments. Rather, the data storage device and the operating method thereof described herein should only be limited in light of the claims that follow when taken in conjunction with the above description and accompanying drawings.

What is claimed is:

1. A method for operating a data storage device, comprising:
    reading data and storage parity data from a page;
    generating transformation parity data through a masking operation on the storage parity data;
    performing an error correcting operation on the data, based on the transformation parity data;
    generating recovery parity data through a masking operation on the transformation parity data; and
    determining whether the page is an erased page, based on a logic operation on respective bits of error-corrected data and the recovery parity data.

2. The method according to claim 1, wherein the masking operation on the storage parity data includes a logic operation on the storage parity data and a masking pattern.

3. The method according to claim 2, wherein the transformation parity data includes error detection information for erase data, when the storage parity data is read from the erased page.

4. The method according to claim 2,
wherein the masking operation on the transformation parity data includes a logic operation on the transformation parity data and the masking pattern.

5. The method according to claim 2, before the reading of the data and the storage parity data, further comprising:
performing an erase operation on a nonvolatile memory region,
wherein the data and the storage parity data are read from the nonvolatile memory region.

6. The method according to claim 2, before the reading of the data and the storage parity data, further comprising:
generating original parity data including error detection information of the data;
generating the storage parity data through a logic operation on the original parity data and the masking pattern; and
storing the data and the storage parity data.

7. The method according to claim 6, wherein the transformation parity data has the same value as the original parity data.

8. The method according to claim 2, wherein, when the storage parity data is read from the erased page, the storage parity data does not include error detection information for the data.

9. The method according to claim 1, wherein the recovery parity data has the same value as the storage parity data.

10. The method according to claim 1, wherein the determining of whether the page is the erased page further comprises:
determining whether the error-corrected data and the recovery parity data have a value corresponding to erase data, based on the logic operation on the respective bits of the error-corrected data and the recovery parity data.

11. A data storage device comprising:
a nonvolatile memory device suitable for reading data and storage parity data from a page;
an error correction code (ECC) unit suitable for generating transformation parity data through a masking operation on the storage parity data, performing an error correcting operation on the data, based on the transformation parity data, and generating recovery parity data through a masking operation on the transformation parity data; and
an erased page determination unit suitable for determining whether the page is an erased page, based on a logic operation on respective bits of error-corrected data and the recovery parity data.

12. The data storage device according to claim 11, wherein the masking operation on the storage parity data includes a logic operation on the storage parity data and a masking pattern.

13. The data storage device according to claim 12, wherein, when the storage parity data is read from the erased page in the nonvolatile memory device, the transformation parity data generated from the ECC unit includes error detection information for erase data.

14. The data storage device according to claim 12, wherein the masking operation on the transformation parity data includes a logic operation on the transformation parity data and the masking pattern.

15. The data storage device according to claim 12, wherein the ECC unit generates original parity data, including error detection information of the data, and generates the storage parity data through a logic operation on the original parity data and the masking pattern.

16. The data storage device according to claim 15, wherein the transformation parity data has the same value as the original parity data.

17. The data storage device according to claim 11, wherein the recovery parity data has the same value as the storage parity data.

18. The data storage device according to claim 11, wherein the erased page determination unit determines whether the error-corrected data and the recovery parity data have a value corresponding to erase data, based on the logic operation on the respective bits of the error-corrected data and the recovery parity data, to determine whether the page is the erased page.

* * * * *